United States Patent [19]

Smith

[11] 4,308,526
[45] Dec. 29, 1981

[54] BINARY TO ONE OF N DECODER HAVING A TRUE AND A COMPLEMENT OUTPUT

[75] Inventor: Philip S. Smith, Austin, Tex.

[73] Assignee: Motorola Inc., Schaumburg, Ill.

[21] Appl. No.: 187,384

[22] Filed: Sep. 15, 1980

[51] Int. Cl.³ ............................................. H03K 13/25
[52] U.S. Cl. ............................. 340/347 DD; 307/449
[58] Field of Search ............... 340/347 DD; 307/449, 307/463; 365/230, 189

[56] References Cited

U.S. PATENT DOCUMENTS 3,631,465  12/1971  Heeren ....................... 340/347 DD
3,717,868   2/1973  Crawford .................... 340/347 DD
3,825,888   7/1974  Kawagoe .................... 340/347 DD
3,851,186  11/1974  Koo .......................... 340/347 DD Primary Examiner—Charles D. Miller
Attorney, Agent, or Firm—Joe E. Barbee

[57] ABSTRACT

A digital decoder for use with a dual bus system is provided having a minimum number of transistors. The decoder is easily expandable to decode larger binary coded input signals. As a minimum only six transistors are needed to decode a three-bit binary input signal to provide outputs for a data bus and its complement. By using a minimum number of transistors, less current is required for the decoder. The circuitry used to provide each decoded output is repeated in a manner which conserves silicon area when the decoder is placed on silicon. A minimum number of control lines are used.

10 Claims, 3 Drawing Figures

| INPUT | | | OUTPUT | | | |
|---|---|---|---|---|---|---|
| A | B | C | DB0 | $\overline{DB0}$ | DB1 | $\overline{DB1}$ |
| 0 | 0 | 0 | 0 | X | X | 0 |
| 0 | 0 | 1 | X | 0 | 0 | X |
| 0 | 1 | 0 | X | 0 | X | 0 |
| 0 | 1 | 1 | X | 0 | X | 0 |
| 1 | 0 | 0 | X | 0 | X | 0 |
| 1 | 0 | 1 | X | 0 | X | 0 |
| 1 | 1 | 0 | X | 0 | X | 0 |
| 1 | 1 | 1 | X | 0 | X | 0 |
| 0/0 | X | X | X | X | X | X |

FIG 2

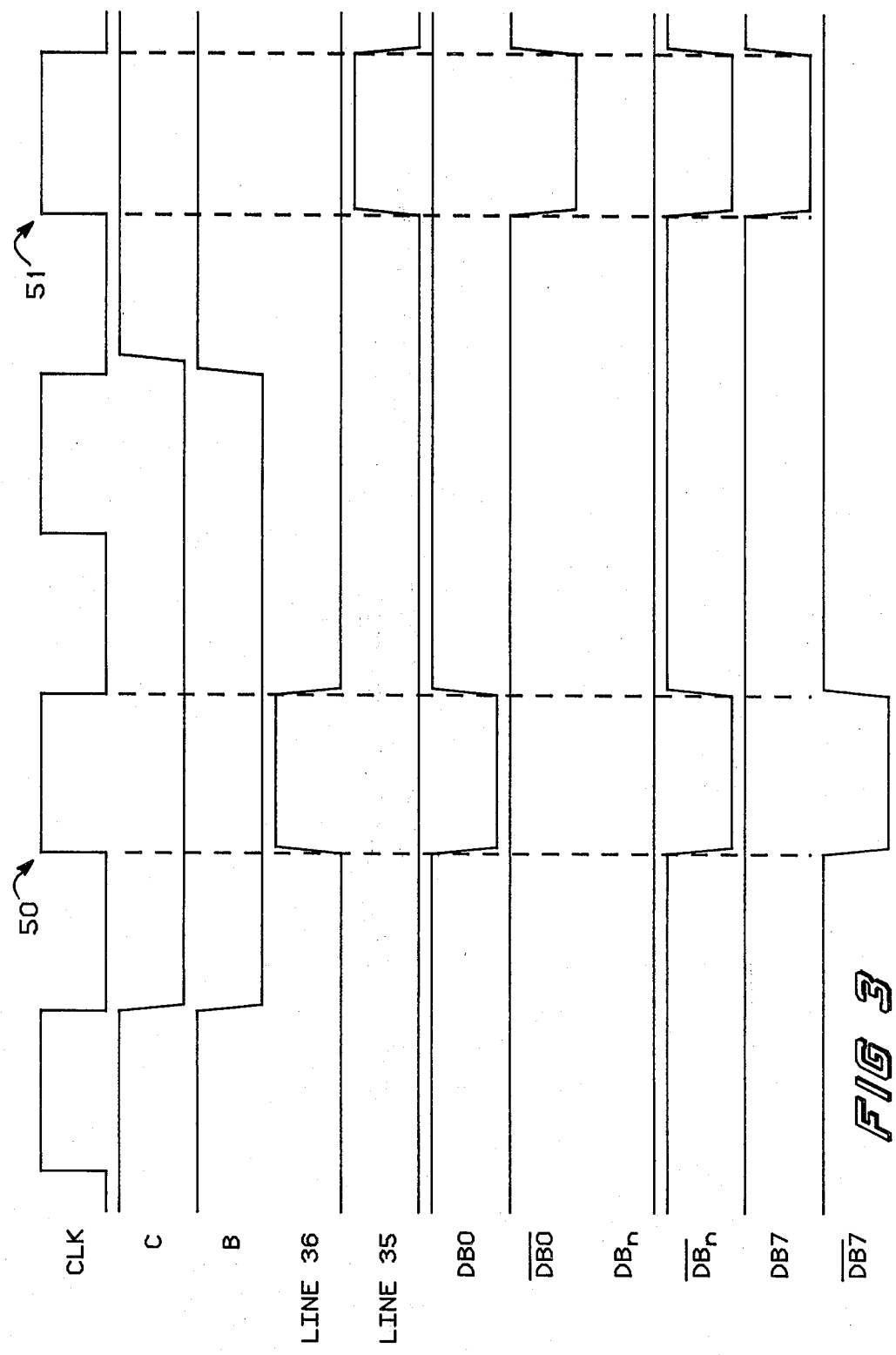

BINARY TO ONE OF N DECODER HAVING A TRUE AND A COMPLEMENT OUTPUT

This invention relates, in general, to digital decoders, and more particularly, to a digital decoder having a true and a complement output.

Digital decoders are well-known and are commonly used in digital systems to decode binary signals. One of the more common types of decoders is called a one-of-eight decoder, which means that the decoder will decode a signal and select one out of a possible eight outputs. A one-of-eight decoder will typically require three inputs whereas a one-of-sixteen decoder will require four inputs and provide sixteen outputs.

One well-known decoder used in the past is a one-of-eight decoder having a plurality of three input NOR gates. If this type of decoder is desired to be used in a dual bus system which requires a true and a complement output from the decoder then the output of the NOR gate must also be fed through an inverter to provide the complement output. In some cases it is desirable to provide a strobed output and then the output of the NOR gate and the output of the inverter are fed through transistors which are gated on by a strobe signal. One of the disadvantages of this type of a system is that it requires a relatively large area of silicon. In addition, when the output is strobed, strobe lines must be provided in addition to the six digital input lines which are needed in a one-of-eight decoder. It is desirable to keep the size of the decoder small, to use a minimum amount of power, and to reduce the number of control lines needed.

Accordingly, it is an object of the present invention to provide a digital decoder which lends itself to be incorporated on a minimum amount of silicon area.

Another advantage of the present invention is to provide a digital decoder having a true and a complement output which uses a minimum number of transistors thereby resulting in a savings of power.

Yet another object of the present invention is to provide a decoder having a strobed output which requires a minimum number of input signals.

SUMMARY OF THE INVENTION

In carrying out the above and other objects of the present invention, there is provided a decoder capable of decoding a binary signal containing a plurality of binary bits. The decoder is capable of providing a true and a complement output. The decoder has a series of transistors connected between the true output and a reference potential. Each of the transistors in the series is controlled by one of the bits in the binary signal to be decoded. A second plurality of transistors is coupled from the reference potential to the complement output. Each of the transistors in the second plurality of transistors is controlled by one of the bits in the binary signal to be decoded. A single transistor is coupled from the complement output to the potential reference and is controlled by one of the bits in the binary signal to be decoded.

The subject matter which is regarded as the invention is set forth in the appended claims. The invention itself, however, together with further objects and advantages thereof, may be better understood by referring to the following detailed description taken in conjunction with the accompanying drawings.

BRIEF DESCRIPTION OF THE DRAWINGS

FIG. 2 is a partial truth table for the decoder illustrated in FIG. 1;
and
FIG. 3 is a timing diagram which may be useful in better understanding the illustrated implementation of the present invention.

Figure 1:
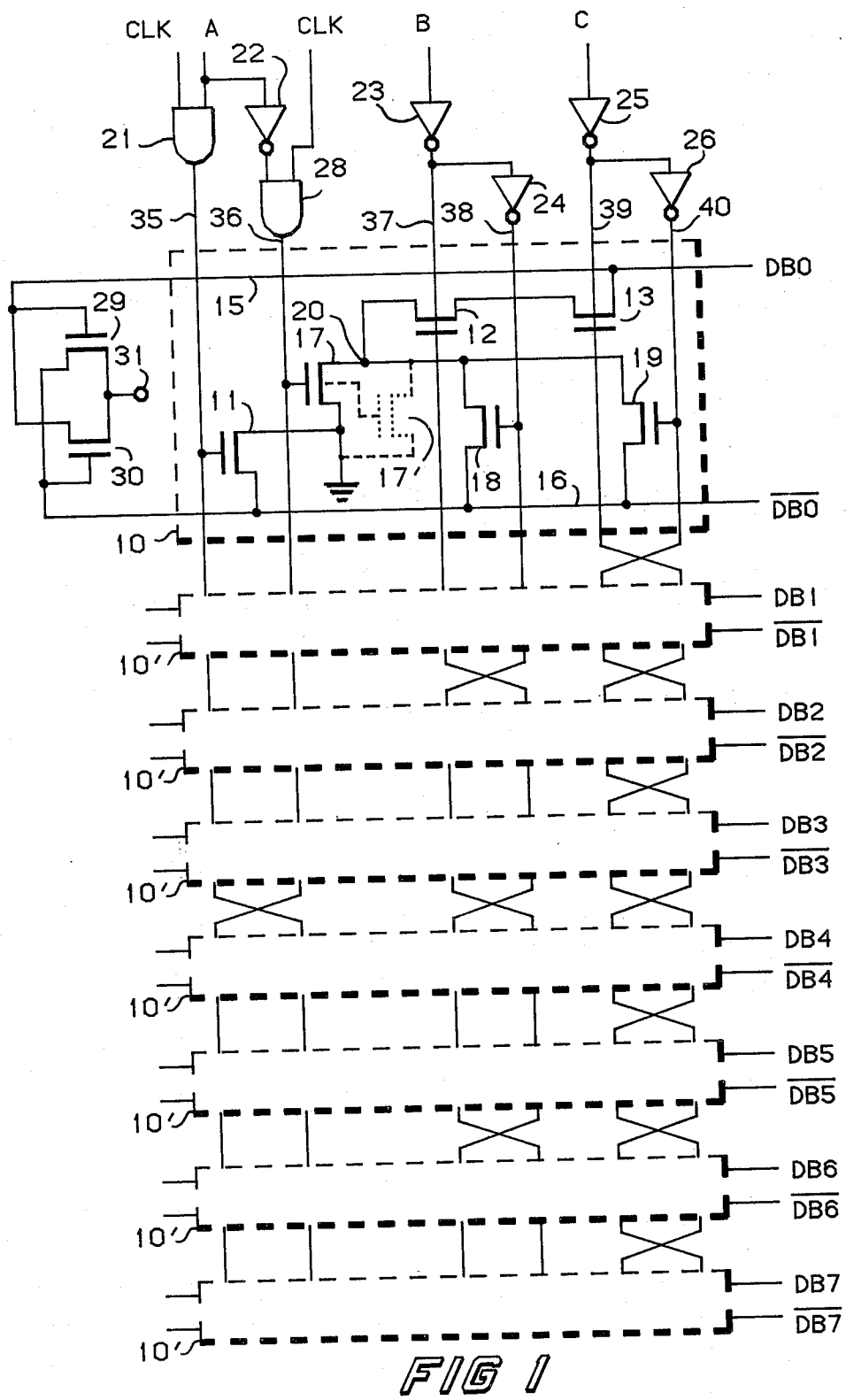
FIG. 1 is a schematic representation of a decoder using the present invention.

The exemplification set out herein illustrates the preferred embodiment of the invention in one form thereof, and such exemplification is not to be construed as limiting in any manner.

DETAILED DESCRIPTION OF THE DRAWINGS

FIG. 1 illustrates a one-of-eight decoder having a true and a complement output for each of its eight outputs. Three binary input signals A, B and C are decoded by the decoder. These three binary bits provide coded inputs to the decoder on six lines 35, 36, 37, 38, 39, and 40. Input A and its complement are logically combined with a clock signal (CLK) by AND gates 21 and 28 respectively. The complement of A is obtained from inverter 22. The strobed signal representing input $\overline{A}$ appears on line 35, while the strobed signal representing input A appears on line 36. The output of AND gate 21 is connected to the input of inverter 22 which provides an output connected to an input of AND gate 28. The B input is inverted by inverter 23 and presented on line 37 as the complement $\overline{B}$. The output of inverter 23 also goes to an input of inverter 24 which provides an output on line 38 which provides input B. Input C is inverted by inverter 25 and is presented on line 39 as input $\overline{C}$. The output of inverter 25 also goes to the input of an inverter 26. The output of inverter 26 goes to line 40 which provides input C to the decoder.

The circuitry enclosed within dotted box 10 provides one decoded output having a true and a complement component for zero data bus DB0 and its complement $\overline{DB0}$, respectively. transistor 11 is coupled from data bus ($\overline{DB0}$) 16 to a potential reference which is illustrated as ground. The gate electrode of transistor 11 is connected to line 35. Transistors 12 and 13 are connected in series from data bus (DB0) 15 to node 20. The gate electrode of transistor 12 is connected to line 37, and the gate electrode of transistor 13 is connected to line 39. Transistor 17 is coupled between node 20 and the reference potential which is illustrated as ground. The gate electrode of transistor 17 is connected to line 36. This arrangement places transistors 12, 13, and 20 in series from data bus 15 to the reference potential. Each one of the series connected transistors is controlled by a different one of the input bits of the binary signal to be decoded.

Transistor 18 is coupled from node 20 to data bus 16 and has its gate electrode connected to line 38. Transistor 19 is coupled from node 20 to data bus 16 and has its gate electrode connected to line 40. Data bus 15 provides a true output for this section of the decoder and data bus 16 provides the complement output. Transistors 18 and 19 are in parallel whereas transistor 11 is coupled from the reference potential to data bus 16. Transistors 11, 18, and 19 are each controlled by one of the input bits of the binary signal to be decoded. It should be noted that there is the possibility of a sneak path existing between data bus 15 and its complement data bus 16 through transistors 12, 13, and 18 or 19 when inputs B and C are changing polarity at the same time. This potential path could cause a glitch to be coupled between buses 15 and 16. To prevent such an occurrence transistor 17 can be duplicated by transistor 17' which is indicated in phantom by dotted lines. Transistor 17 would have its gate electrode connected to line 36, its source electrode connected to the source electrode of transistor 17 which is ground and would have its drain electrode connected to transistors 18 and 19. The connection from transistors 18 and 19 to node 20 would then be severed so that no path could exist from data bus 15 to its complement data bus 16 through transistors 12 and 13 to transistors 18 and 19. Although this adds an additional transistor to the decoder it could prevent transients from being reflected between the data bus and its complement especially in systems not having a latch between the data bus and its complement such as provided by transistors 29 and 30.

The circuitry enclosed within dotted box 10 is reproduced within each of the dotted boxes 10'. For an eight bit system there would be eight circuits such as enclosed within dotted box 10. In order to expand the decoding concept enclosed within dotted box 10 to provide a one-of-sixteen output it would be necessary to add an additional transistor in series with transistors 12 and 13 and an additional transistor in parallel with transistors 18 and 19. This would entail two additional transistors which would be controlled by the additional binary input signal.

Lines 39 and 40 carry the least significant bit and its complement into the decoder and these lines are reversed between each one of the decoding sections contained within dotted boxes 10 and 10'. Lines 37 and 38 carry the next least significant bit and these lines are reversed between every second decoding section. Lines 35 and 36 carry the most significant bit for a one-of-eight decoder and these lines are reversed between the fourth and fifth decoding sections of the decoder. This arrangement of the decoder results in a considerable amount of space savings and can be made in compact size especially since each decoding section contains a minimum number of transistors.

A transistor 29 is coupled from a voltage terminal 31 to data bus 16, and a transistor 30 is coupled from a voltage terminal 31 to data bus 15. The gate electrode of transistor 30 is connected to data bus 16 while the gate electrode of transistor 29 is connected to data bus 15. The purpose of these transistors is to drive the non-selected data bus 15 or 16 to a voltage level approaching the voltage appearing on voltage terminal 31 when that particular data bus is not selected by the decoder. Since the reference potential used by the decoder section within dotted line 10 is represented as ground the selected bus will always be placed at ground potential and therefore it may be desirable to drive the non-selected data bus to a logic level "1" which can be done by the latch arrangement of transistors 29 and 30. This latch arrangment can be used on each set of outputs. It will be understood that if the decoder is arranged to drive a selected output to a "high" level, then the latch arrangement would be adjusted to drive the non-selected output to a "low" level.

The operation of the decoder will now be discussed with reference to FIGS. 1 and 2. FIG. 2 is a truth table for the decoder showing a selection of only two of the buses. The two buses are DB0 and DB1. The truth table is easily expanded to show the selection of the rest of the buses; however, in an attempt to simplify the explanation the table has been truncated since by mere inspection of the table shown the remainder of the table becomes clear. The X's in the input columns indicate a "don't care" state which means that no matter what the input is it will have no affect on the output. An X in the output columns indicates a non-selected output which leaves that output in a floating or tri-state configuration. A 0/0 appears as a last input in the A column. This means that the input signal on line 35 and the input signal on line 36 are both zeros. Both of these signals will be zeros when the clock signal input to AND gates 21 and 28 is a logic level "zero". The clock input signal to AND gates 21 and 28 is preferable a narrow clock signal and can be the combination of a timing signal and an operating phase of the system of which the decoder is a portion thereof.

When all three inputs A, B, and C are zeros the input signal appearing on lines 35, 38 and 40 wil be zeros and therefore transistors 11, 18 and 19 will not be enabled. Since transistor 11 is not enabled and neither are transistors 18 or 19 then complementary data bus ($\overline{DB0}$) 16 will not be selected and will remain unchanged. Line 36 will have a signal which will enable transistor 17 and lines 37 and 39 will also have a signal present thereby enabling transistors 12 and 13 which places data bus (DB0) 15 at the reference level coupled to the source electrode of transistor 17. Since lines 39 and 40 are reversed before arriving at the first circuit 10' which controls DB1 and $\overline{DB1}$, DB1 will not be selected however $\overline{DB1}$ will be placed at the reference level, illustrated as ground, since in the first circuit 10', transistor 19 will be enabled. When inputs A and B are logic level "0's" and C is a logic level "1" transistors 11, 18 and 13 will not enabled while transistors 17, 12 and 19 will be enabled. Since transistor 13 is not enabled data bus DB0 will remain unchanged while complementary data bus $\overline{DB0}$ will be placed at a logic "0" level through transistors 19 and 17. Since lines 39 and 40 are reversed for the first circuit 10', transistor 19 would not be enabled whereas transistor 13 would be. This would provide a path from the reference level through transistors 17, 12, and 13 to data bus DB1, which means that data bus DB1 is the selected output.

When all three inputs are logic level "1's" transistors 17, 12, and 13 will not be enabled thereby maintaining data bus DB0 in an unchanged state. However, circuit 10' for data bus DB7 and its complement data bus $\overline{DB7}$ will have its transistors 17, 12, and 13 enabled and will therefore place data bus DB7 at a logic "0" level. Data bus DB7 is the only selected data bus because of the reversals occurring in lines 35 and 36, 37 and 38, and 39 and 40 prior to reaching circuit 10' for data bus DB7. When the clock signal is not present for AND gates 21 and 28, lines 35 and 36 will have a logic "0" which means that transistors 11 and 17 will not be enabled. And therefore none of the states of the data buses or their complements can be changed since the transistors connected to the reference level will not be enabled.

FIG. 3 is a timing diagram which may be of benefit in further understanding the operation of the decoder illustrated in FIG. 1. The top waveform CLK illustrates the clock signal used to strobe input A. The second and third waveforms illustrate inputs C and B respectively. The waveforms labeled line 36 and 35 represent strobed inputs $\overline{A}$ and A, respectively. Data buses DB0 and DB7 and their complements are also illustrated. The two waveforms labeled $DB_n$ and $\overline{DB_n}$ represent data buses DB1 through DB6 and their complements, respectively. Note that during the time period when clock signal CLK is low that the data buses are precharged to a high level by circuitry not shown. Also, when the input signals B and C change no effect is noted on the data buses.

The DBO and DB7 waveforms illustrate a decoded zero and a decoded seven respectively. At time frame 50, inputs A, B, and C are low and therefore data bus DBO is pulled low. Note that the complementary data buses of the non-selected data buses are also pulled low. At time frame 50 line 36 appears as a high since it represents the strobed $\overline{A}$ input signal. At time frame 51, inputs A, B, and C are all logic "ones" and, as shown, data bus DB7 is selected, while all the non-selected complementary data buses are also pulled low to the reference level.

I claim:

1. A digital decoder useful in a digital system requiring a true and a complement output, comprising: a plurality of decoding circuits, wherein the number of decoding circuits is equal to $2^n$ where n is the number of input bits to be decoded, the decoding circuits having a first, a second, and a third transistor all coupled in series between a first output and a voltage terminal wherein the first transistor is connected to the first output and the third transistor is connected to the voltage terminal, the first transistor being controlled by a first input signal, the second transistor being controlled by a second input signal, and the third transistor being controlled by a third input signal, a fourth transistor coupled from the voltage terminal to a second output and being controlled by the second input signal, a fifth transistor coupled from the voltage terminal to the second output, the fifth transistor being controlled by the first input signal, and a sixth transistor coupled from the second output and the voltage terminal and being controlled by the third input signal.

2. The digital decoder of claim 1 wherein the transistors are field effect transistors.

3. The digital decoder of claim 1 wherein the first, second, and third inputs represent the input bits to be decoded.

4. The digital decoder of claim 3 wherein the third input signal includes a coded input bit logically combined with a timing signal.

5. The digital decoder of claim 1 wherein the first and second inputs represent a selected true and a selected complement output.

6. The digital decoder of claim 5 wherein the voltage terminal is the ground terminal.

7. The digital decoder of claim 1 wherein n is equal to three and the third input signal is a combination of a bit to be decoded and a timing signal, there further being eight identical decoding circuits since n equals three, and where in the first decoding circuit, the first transistor is controlled by a complement of the first input signal, the second transistor is controlled by a complement of the second input signal, the third transistor is controlled by a complement of the third input signal, the fourth transistor is controlled by the second input signal, the fifth transistor is controlled by the first input signal, the sixth transistor is controlled the third input signal; and wherein the first input signal and its complement are reversed for each subsequent decoding circuit, the second input signal and its complement are reversed for every second decoding circuit, and the third input signal and its complement are reversed for every fourth decoding circuit.

8. A digital decoder capable of decoding a binary coded signal having at least three bits and capable of selecting one of a plurality of outputs depending on information contained in the binary coded signal, the selected output will have a true and a complement output, comprising:

(a) a first transistor coupled to a true output and being controlled by a first bit of the at least three bits, (b) at least a second transistor coupled in series with the first transistor and being controlled by a second bit of the at least three bits, (c) a third transistor coupled to the at least second transistor and coupled to a reference potential and being controlled by a third bit of the at least three bits, (d) a fourth transistor coupled from the complement output to the reference potential and being controlled by the first bit, (e) a fifth transistor coupled from the complement output to the reference potential and being controlled by the second bit, (f) a sixth transistor coupled between the complement output and the reference output and being controlled by the third bit, (g) elements set out in (a) through (f) above being repeated $2^n$ times where n equals the number of bits in the binary coded signal.

9. The digital decoder of claim 8 wherein the bit controlling the transistors is represented by a true or complement bit signal, and wherein the third bit is combined with a timing signal to represent the third bit and its complement.

10. The digital decoder of claim 8 wherein a seventh transistor is used to couple the fourth and fifth transistors to the reference potential, the seventh transistor being controlled by the third bit of the at least three bits.

* * * * *